United States Patent
Kuruba Buchannagari et al.

(10) Patent No.: US 9,383,964 B1
(45) Date of Patent: *Jul. 5, 2016

(54) INDEPENDENT GAME AND CHAT VOLUME CONTROL

(71) Applicant: Voyetra Turtle Beach, Inc., Valhalla, NY (US)

(72) Inventors: Shobha Devi Kuruba Buchannagari, San Jose, CA (US); Kevin Robertson, San Jose, CA (US); Scott Warren, San Jose, CA (US)

(73) Assignee: VOYETRA TURTLE BEACH, INC., Valhalla, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/693,555

(22) Filed: Apr. 22, 2015

Related U.S. Application Data

(63) Continuation of application No. 14/687,028, filed on Apr. 15, 2015.

(51) Int. Cl.
| | |
|---|---|
| *H04R 1/10* | (2006.01) |
| *G06F 3/16* | (2006.01) |
| *H03G 3/02* | (2006.01) |
| *A63F 13/54* | (2014.01) |

(52) U.S. Cl.
CPC .............. *G06F 3/165* (2013.01); *A63F 13/54* (2014.09); *H03G 3/02* (2013.01)

(58) Field of Classification Search
USPC ......... 381/1, 2, 17, 18, 28, 58, 74, 77, 81, 85, 381/90, 98, 103, 104, 107, 119, 306, 307, 381/309, 310, 311; 700/94; 463/1, 35, 39, 463/40–43
See application file for complete search history.

(56) References Cited

U.S. PATENT DOCUMENTS

| | | | | |
|---|---|---|---|---|
| 2002/0172379 | A1* | 11/2002 | Cliff | 381/119 |
| 2010/0202621 | A1* | 8/2010 | Murata et al. | 381/26 |
| 2011/0130203 | A1* | 6/2011 | Reiss et al. | 463/35 |
| 2014/0073429 | A1* | 3/2014 | Meneses et al. | 463/35 |
| 2015/0065248 | A1* | 3/2015 | LaTendresse et al. | 463/35 |

* cited by examiner

*Primary Examiner* — Vivian Chin
*Assistant Examiner* — Friedrich W Fahnert
(74) *Attorney, Agent, or Firm* — McAndrews, Held & Malloy, Ltd.

(57) ABSTRACT

Methods and systems are provided for independent audio volume control. For example, an audio component (e.g., implemented in an element of an audio setup) may control generation and/or outputting of a combined-game-and-chat audio signals. The audio component may receive user input comprising one or both of: a setting for a desired volume of a chat audio component of the combined-game-and-chat audio signal, and a setting for a desired volume of a game audio component of the combined-game-and-chat audio signal. The audio component may determine, based on the user input, a corresponding mix setting for mixing together of the chat audio component and the game audio component in an audio source to generate the combined-game-and-chat audio signal and a corresponding volume setting applicable at an audio output element; provide the mix setting to the audio source; and provide the volume setting to the audio output element.

22 Claims, 8 Drawing Sheets

INDEPENDENT GAME AND CHAT VOLUME CONTROL

CLAIM OF PRIORITY

This application is a continuation of U.S. patent application Ser. No. 14/687,028 filed on Apr. 15, 2015. The above identified application is hereby incorporated herein by reference in its entirety.

TECHNICAL FIELD

Aspects of the present application relate to audio systems and solutions, particularly with respect to electronic gaming. More specifically, to methods and systems for independent game and chat volume control.

BACKGROUND

Limitations and disadvantages of conventional approaches to audio processing and audio output devices will become apparent to one of skill in the art, through comparison of such approaches with some aspects of the present method and system set forth in the remainder of this disclosure with reference to the drawings.

BRIEF SUMMARY

Methods and systems are provided for independent game and chat volume control, substantially as illustrated by and/or described in connection with at least one of the figures, as set forth more completely in the claims.

DETAILED DESCRIPTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. The term "and/or" in this example has the same scope as the term "one or both of x and y". As another example, "x, y, and/or z" means any element of the seven-element set {(x), (y), (z), (x, y), (x, z), (y, z), (x, y, z)}. The term "and/or" in this example has the same scope as the term "one or more of x, y and z". As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by some user-configurable setting, factory trim, etc.).

In multiplayer games that are played over a local area network or the internet via a console such as Microsoft Xbox® or Sony Playstation®, game audio and voice are combined and provided via an audio output (e.g., an analog or digital output audio jack for wired output or a radio for wireless output) to which a user may connect a headset. One problem with this form of game play is that the game audio in the headset has a wide dynamic range. In other words, at times a low volume can rapidly increase to a high volume when, for instance, an explosion or other dynamic event occurs in the game. These loudness dynamics may be sustained for long periods of time, for instance during heated battle in an action game. A consequence of this wide dynamic range is that if the volume of the voice communication signals (the "chat" volume) is set for a comfortable volume level during normal game passages, they cannot be heard over the loud game audio when dynamic game passages occur. Aspects of this disclosure provide for controlling volume of chat and/or game components of combined-chat-and-game audio signals to maintain the user's ability to hear the chat audio.

Figure 1:
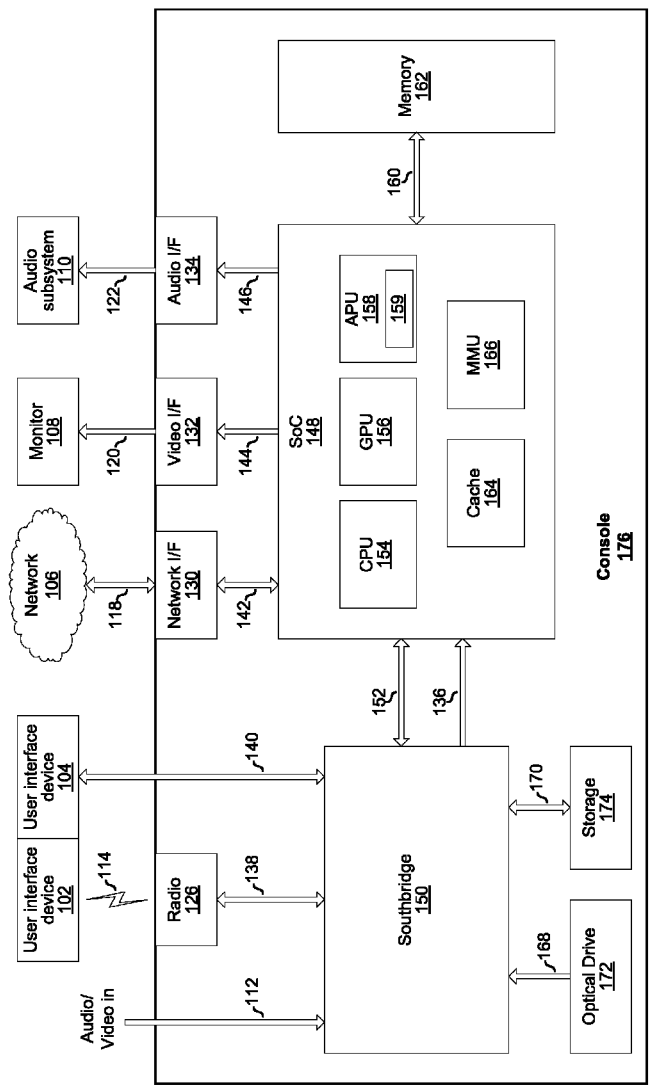
FIG. 1 depicts an example gaming console.

FIG. 1 depicts an example gaming console. Shown in FIG. 1 is a game console 176.

The game console 176 may be, for example, a Windows computing device, a UNIX computing device, a Linux computing device, an Apple OSX computing device, an Apple iOS computing device, an Android computing device, a Microsoft Xbox, a Sony Playstation, a Nintendo Wii, or the like.

The game console 176 may comprise suitable circuitry for implementing various aspects of the present disclosure. The example game console 176 shown in FIG. 1 comprises a video interface 124, radio 126, data interface 128, network interface 130, video interface 132, audio interface 134, southbridge 150, main system on chip (SoC) 148, memory 162, optical drive 172, and storage device 174. The SoC 148 comprises central processing unit (CPU) 154, graphics processing unit (GPU) 156, audio processing unit (APU) 158, cache memory 164, and memory management unit (MMU) 166. The various components of the game console 176 are communicatively coupled through various busses/links 136, 128, 142, 14, 146, 152, 160, 169, and 170.

The southbridge 150 comprises circuitry that supports one or more data bus protocols such as High-Definition Multimedia Interface (HDMI), Universal Serial Bus (USB), Serial Advanced Technology Attachment 2 (SATA 2), embedded multimedia card interface (e.MMC), Peripheral Component Interconnect Express (PCIe), or the like. The southbridge 150 may receive audio and/or video from an external source via link 112 (e.g., HDMI), from the optical drive (e.g., Blu-Ray) 172 via link 168 (e.g., SATA 2), and/or from storage 174 (e.g., hard drive, FLASH memory, or the like) via link 170 (e.g., SATA 2 and/or e.MMC). Digital audio and/or video is output to the SoC 148 via link 136 (e.g., CEA-861-E compliant video and IEC 61937 compliant audio). The southbridge 150 exchanges data with radio 126 via link 138 (e.g., USB), with external devices via link 140 (e.g., USB), with the storage 174 via the link 170, and with the SoC 148 via the link 152 (e.g., PCIe).

The radio 126 may comprise circuitry operable to communicate in accordance with one or more wireless standards such as the IEEE 802.11 family of standards, the Bluetooth family of standards, and/or the like.

The network interface 130 may comprise circuitry operable to communicate in accordance with one or more wired standards and to convert between wired standards. For example, the network interface 130 may communicate with the SoC 148 via link 142 using a first standard (e.g., PCIe) and may communicate with a network 106 using a second standard (e.g., gigabit Ethernet).

The video interface 132 may comprise circuitry operable to communicate video in accordance with one or more wired or wireless video transmission standards. For example, the video interface 132 may receive CEA-861-E compliant video data via link 144 and encapsulate/format/etc., the video data in accordance with an HDMI standard for output to the monitor 108 via an HDMI link 120.

The audio interface 134 may comprise circuitry operable to communicate audio in accordance with one or more wired or wireless audio transmission standards. For example, the audio interface 134 may receive CEA-861-E compliant video data via link 144 and encapsulate/format/etc. the video data in accordance with an HDMI standard for output to the monitor 108 via an HDMI link 120.

The central processing unit (CPU) 154 may comprise circuitry operable to execute instructions for controlling/coordinating the overall operation of the game console 176. Such instructions may be part of an operating system of the console and/or part of one or more software applications running on the console.

The graphics processing unit (GPU) 156 may comprise circuitry operable to perform graphics processing functions such as compression, decompression, encoding, decoding, 3D rendering, and/or the like.

The audio processing unit (APU) 158 may comprise circuitry operable to perform audio processing functions such as volume/gain control, compression, decompression, encoding, decoding, surround-sound processing, and/or the like to output single channel or multi-channel (e.g., 2 channels for stereo or 5, 7, or more channels for surround sound) audio signals. The APU 158 comprises a memory element (e.g., a hardware or software register) 159 which stores configuration data including gain/volume settings. The configuration data may be modified via a graphical user interface (GUI) of the console and/or via an application programming interface (API) provided by the console 176.

The cache memory 164 comprises high-speed memory (typically DRAM) for use by the CPU 154, GPU 156, and/or APU 158. The memory 162 may comprise additional memory for use by the CPU 154, GPU 156, and/or APU 158. The memory 162, typically DRAM, may operate at a slower speed than the cache memory 164 but may also be less expensive than cache memory as well as operate at a higher-speed than the memory of the storage device 174. The MMU 166 controls accesses by the CPU 154, GPU 156, and/or APU 158 to the memory 162, the cache 164, and/or the storage device 174.

In FIG. 1, the example game console 176 is communicatively coupled to a user interface device 102, a user interface device 104, a network 106, a monitor 108, and audio subsystem 110.

Each of the user interface devices 102 and 104 may comprise, for example, a game controller, a keyboard, a motion sensor/position tracker, or the like. The user interface device 102 communicates with the game console 176 wirelessly via link 114 (e.g., Wi-Fi Direct, Bluetooth, and/or the like). The user interface device 102 communicates with the game console 176 via the wired link 140 (e.g., USB or the like).

The network 160 comprises a local area network and/or a wide area network. The game console 176 communicates with the network 106 via wired link 118 (e.g., Gigabit Ethernet).

The monitor 108 may be, for example, a LCD, OLED, or PLASMA screen. The game console 176 sends video to the monitor 108 via link 120 (e.g., HDMI).

The audio subsystem 110 may be, for example, a headset, a combination of headset and audio basestation, or a set of speakers and accompanying audio processing circuitry. The game console 176 sends audio to the monitor 108 via link(s) 120 (e.g., S/PDIF for digital audio or "line out" for analog audio).

Figure 2:
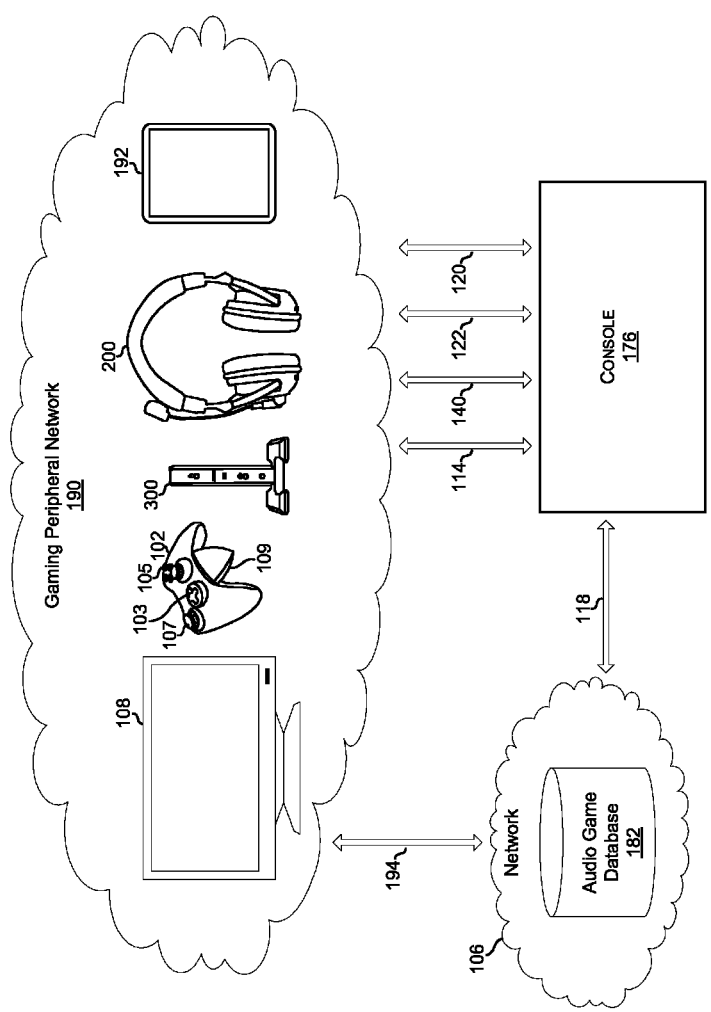
FIG. 2 depicts the example gaming console and an associated network of peripheral devices.

FIG. 2 depicts the example gaming console and an associated network of peripheral devices. Shown in FIG. 2 is the console 176 of FIG. 1, connected to a plurality of peripheral devices and a network 106.

The example peripheral devices shown include a monitor 108, a user interface device 102, a headset 200, an audio basestation 300, and a multi-purpose device 192. The monitor 108 and user interface device 102 are as described above. An example implementation of the headset 200 is described below with reference to FIGS. 3A-3C.

In some instances, the user interface device 102 may be a game controller. In this regard, the game controller 102 may have a plurality of control elements (e.g., 103, 105, and 107) which the user may use during gaming. Examples of control elements may comprise buttons, directional pads, joysticks, etc. Further, in some implementations, the game controller 102 may comprise a headset connector 109 which may be used to connect with the headset 200, such as to provide audio feed thereto and/or receive audio input therefrom. The headset connector 109 may comprise suitable circuitry for supporting connectivity with the headset 200, and/or for supporting audio input/output operations based on such connectivity. The connectivity may be provided as wired connection (e.g., using cables, cords, etc.) or may be wireless (e.g., Bluetooth, WiFi, etc.). While shown as an externally distinguishable component, the headset connector 109 need not be limited as such, and it may be embedded within the game controller 102 and/or its functions may be provided by existing circuitry of the game controller 102.

The multi-purpose device 192 may be, for example, a tablet computer, a smartphone, a laptop computer, or the like and that runs an operating system such as Android, Linux, Windows, iOS, OSX, or the like. An example implementation of the multi-purpose device 192 is described below with reference to FIG. 4. Hardware (e.g., a network adaptor) and software (i.e., the operating system and one or more applications loaded onto the device 192) may configure the device 192 for operating as part of the GPN 190. For example, an application running on the device 192 may cause display of a graphical user interface via which a user can access gaming-related data, commands, functions, parameter settings, etc. and via which the user can interact with the console 176 and the other devices of the GPN 190 to enhance his/her gaming experience.

The peripheral devices 102, 108, 192, 200, 300 are in communication with one another via a plurality of wired and/or wireless links (represented visually by the placement of the devices in the cloud of GPN 190). Each of the peripheral devices in the gaming peripheral network (GPN) 190 may communicate with one or more others of the peripheral devices in the GPN 190 in a single-hop or multi-hop fashion. For example, the headset 200 may communicate with the basestation 300 in a single hop (e.g., over a proprietary RF link) and with the device 192 in a single hop (e.g., over a Bluetooth or Wi-Fi direct link), while the tablet may communicate with the basestation 300 in two hops via the headset 200.

As another example, the user interface device 102 may communicate with the headset 200 in a single hop (e.g., over a Bluetooth or Wi-Fi direct link) and with the device 192 in a single hop (e.g., over a Bluetooth or Wi-Fi direct link), while the device 192 may communicate with the headset 200 in two hops via the user interface device 102. These example interconnections among the peripheral devices of the GPN 190 are merely examples, any number and/or types of links among the devices of the GPN 190 is possible.

The GPN 190 may communicate with the console 176 via any one or more of the connections 114, 140, 122, and 120 described above. The GPN 190 may communicate with a network 106 via one or more links 194 each of which may be, for example, Wi-Fi, wired Ethernet, and/or the like.

A database 182 which stores gaming audio data is accessible via the network 106. The gaming audio data may comprise, for example, signatures of particular audio clips (e.g., individual sounds or collections or sequences of sounds) that are part of the game audio of particular games, of particular levels/scenarios of particular games, particular characters of particular games, etc. Data in the database 182 may be downloadable to, or accessed in real-time by, one of more devices of the GPN 190.

Figure 3A:
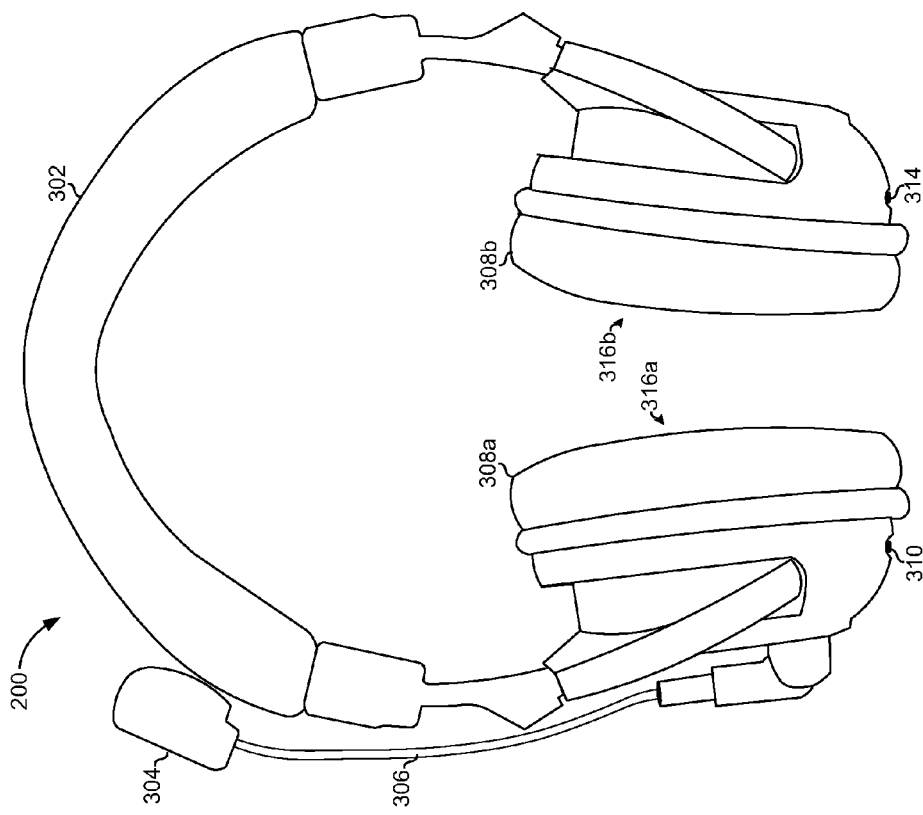
FIGS. 3A and 3B depict two views of an example implementation of a networked gaming headset.
Figure 3B:
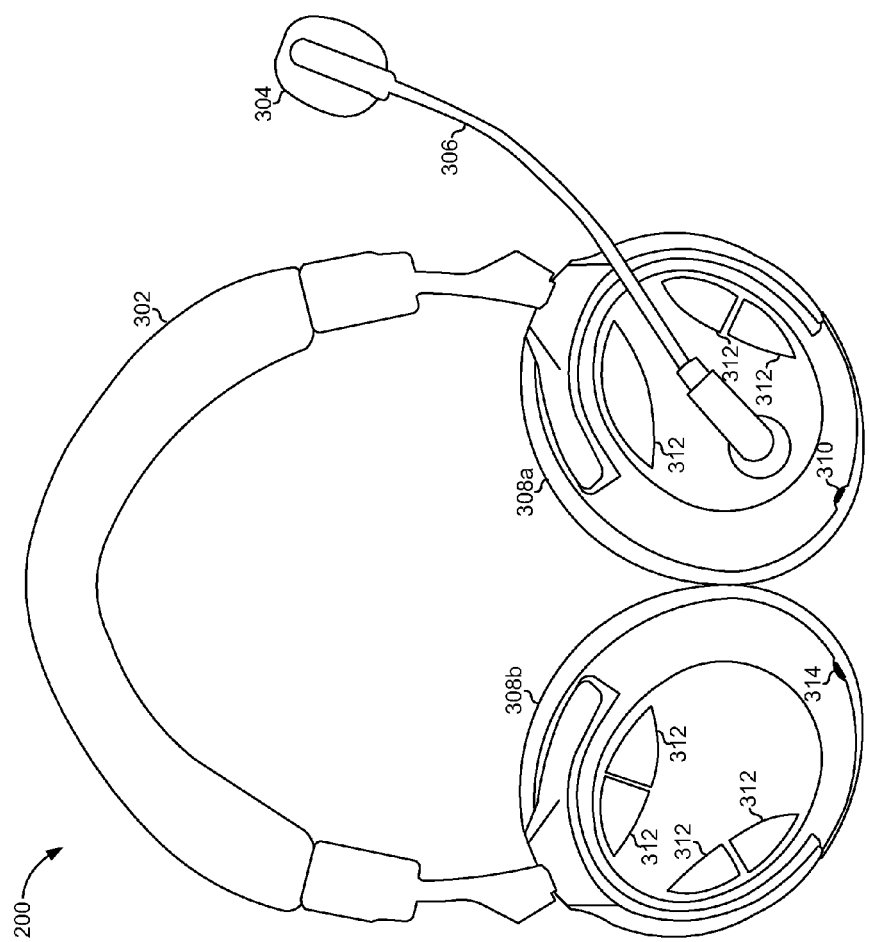

FIGS. 3A and 3B depict two views of an example implementation of a networked gaming headset. Shown in FIGS. 3A and 3B are two views of an example headset 200 that may present audio output by a gaming console such as the console 176.

The headset 200 comprises, for example, a headband 302, a microphone boom 306 with microphone 304, ear cups 308a and 308b which surround speakers 316a and 316b, connector 310, connector 314, and user controls 312.

The connector 310 may be, for example, a 3.5 mm headphone socket for receiving analog audio signals (e.g., receiving chat audio via an Xbox "talkback" cable).

The microphone 304 converts acoustic waves (e.g., the voice of the person wearing the headset) to electric signals for processing by circuitry of the headset and/or for output to a device (e.g., console 176, basestation 300, a smartphone, and/or the like) that is in communication with the headset.

The speakers 316a and 316b convert electrical signals to soundwaves.

The user controls 312 may comprise dedicated and/or programmable buttons, switches, sliders, wheels, etc. for performing various functions. Example functions which the controls 312 may be configured to perform include: power the headset 200 on/off, mute/unmute the microphone 304, control gain/volume of, and/or effects applied to, chat audio by the audio processing circuitry of the headset 200, control gain/volume of, and/or effects applied to, game audio by the audio processing circuitry of the headset 200, enable/disable/ initiate pairing (e.g., via Bluetooth, Wi-Fi direct, or the like) with another computing device, and/or the like.

The connector 314 may be, for example, a USB port. The connector 314 may be used for downloading data to the headset 200 from another computing device and/or uploading data from the headset 200 to another computing device. Such data may include, for example, parameter settings (described below). Additionally, or alternatively, the connector 314 may be used for communicating with another computing device such as a smartphone, tablet computer, laptop computer, or the like.

Figure 3C:
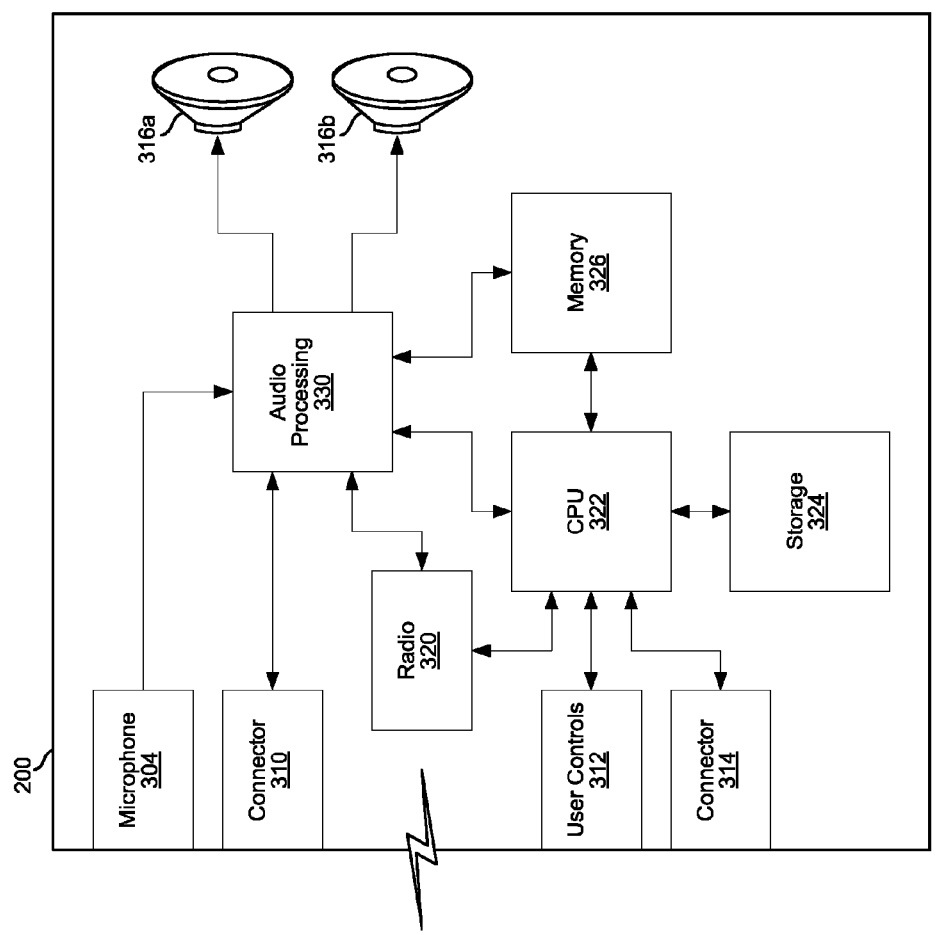
FIG. 3C depicts a block diagram of the example headset of FIGS. 3A and 3B.

FIG. 3C depicts a block diagram of the example headset of FIGS. 3A and 3B. Shown in FIG. 3C is an example circuitry of the headset 200. In addition to the connector 310, user controls 312, connector 314, microphone 304, and speakers 316a and 316b already discussed, shown are a radio 320, a CPU 322, a storage device 324, a memory 326, and an audio processing circuit 330.

The radio 320 may comprise circuitry operable to communicate in accordance with one or more standardized (such as, for example, the IEEE 802.11 family of standards, the Bluetooth family of standards, and/or the like) and/or proprietary wireless protocol(s) (e.g., a proprietary protocol for receiving audio from an audio basestation such as the basestation 300).

The CPU 322 may comprise circuitry operable to execute instructions for controlling/coordinating the overall operation of the headset 200. Such instructions may be part of an operating system or state machine of the headset 200 and/or part of one or more software applications running on the headset 200. In some implementations, the CPU 322 may be, for example, a programmable interrupt controller, a state machine, or the like.

The storage device 324 may comprise, for example, FLASH or other nonvolatile memory for storing data which may be used by the CPU 322 and/or the audio processing circuitry 330. Such data may include, for example, parameter settings that affect processing of audio signals in the headset 200 and parameter settings that affect functions performed by the user controls 312. For example, one or more parameter settings may determine, at least in part, a gain of one or more gain elements of the audio processing circuitry 330. As another example, one or more parameter settings may determine, at least in part, a frequency response of one or more filters that operate on audio signals in the audio processing circuitry 330. As another example, one or more parameter settings may determine, at least in part, whether and which sound effects are added to audio signals in the audio processing circuitry 330 (e.g., which effects to add to microphone audio to morph the user's voice). Particular parameter settings may be selected autonomously by the headset 200 in accordance with one or more algorithms, based on user input (e.g., via controls 312), and/or based on input received via one or more of the connectors 310 and 314.

The memory 326 may comprise volatile memory used by the CPU 322 and/or audio processing circuit 330 as program memory, for storing runtime data, etc.

The audio processing circuit 330 may comprise circuitry operable to perform audio processing functions such as volume/gain control, compression, decompression, encoding, decoding, introduction of audio effects (e.g., echo, phasing, virtual surround effect, etc.), and/or the like. As described above, the processing performed by the audio processing circuit 330 may be determined, at least in part, by which parameter settings have been selected. The processing may be performed on game, chat, and/or microphone audio that is subsequently output to speaker 316a and 316b. Additionally, or alternatively, the processing may be performed on chat audio that is subsequently output to the connector 310 and/or radio 320.

Figure 4:
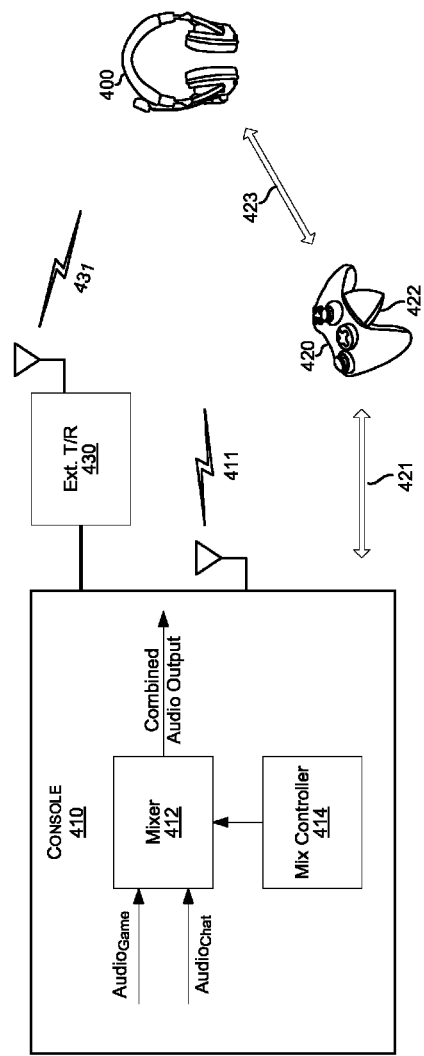
FIG. 4 depicts an example audio arrangement that supports independent game and chat volume control, in accordance with the present disclosure.

FIG. 4 depicts an example audio arrangement that supports independent game and chat volume control, in accordance with the present disclosure. Shown in FIG. 4 are a headset 400, a console 410, a game controller 420, and an external transmitter/receiver (T/R) device 430.

The headset 400 and the console 410 may be similar to the headset 200 and the console 176, as described above with respect to FIGS. 1-3C, and may operate in substantially the same manner. The game controller 420 may be similar to the game controller 102 of FIG. 2. In this regard, the game controller 420 may be utilized by a user during gaming operations. Further, in some instances a headset connector 422, which may be similar to the headset connector 109 of FIG. 2, may be included, and may be used to facilitate connectivity with the headset 400, and/or audio input/output operations based on such connectivity.

As described in more detail above, consoles such as the console 410 may provide audio output to a headset, such as the headset 400, during gaming operations for example. In this regard, the output audio may comprise game audio and chat audio. The audio output may be transmitted directly by the console 410 to the headset 400, using a wired connection (e.g., USB cable), or wirelessly, such as via wireless connection 421 (e.g., Wi-Fi Direct, Bluetooth, or the like), using integrated communication resources in the console 410. In some instances, particularly where the console 410 lacks integrated wireless resources, the external T/R device 430 may be used. The external T/R device 430 may comprise suitable circuitry for support connectivity to the console 410 (e.g., via wired connectors), wireless connectivity to the headset 400, and/or to perform necessary functions (e.g., conversion between different interfaces, processing, etc.) to support forwarding of data (e.g., audio) via the respective connections.

Other means for providing communication between the console 410 and the headset 400 (e.g., to output audio to the headset 400) may include use of the game controller 420. In this regard, the audio may be transmitted to the game controller 420, via a link 421. The link 421 may be a wired link (e.g., similar to the link 140) or a wireless link (e.g., similar to the link 114). The game controller 420 may then send the audio to the headset 400 via a link 423 between these elements (particularly between the headset connector 422 and the headset 400). As with link 421, the link 423 may be a wired link (e.g., similar to the link 140) or a wireless link (e.g., similar to the link 114). The links 421 and 423 need not match—thus the link 421 may be a wired link while link 423 may be a wireless link, and vice versa.

In some instances, the console 410 may be configured to generate combined audio output, which may include, for example, both game audio and chat audio. In this regard, the console 410 may comprise a mixer 412, which may comprise suitable circuitry for mixing the game audio ($Audio_{Game}$) and chat audio ($Audio_{Chat}$) into the combined audio output. The mixing performed by the mixer 412 may be adjusted. The mixing adjustments may comprise changing the proportion of the combined audio output that each of the audio inputs being mixed occupies. The mixing, and adjustments thereof, may be controlled via a mix controller 414. In this regard, the mix controller 414 may comprise suitable circuitry for controlling mixing during generation of audio outputs. For example, the mix controller 414 may adjust (via control signals) gain applied to each of the audio signals being mixed (e.g., to each of $Audio_{Chat}$ and $Audio_{Game}$) to effectuate the desired mixing ratio.

In some instances, the mixing controller 414 may adjust the mixing based on a setting of an audio mix parameter, where different settings of the audio mix parameter correspond to different proportions of $Audio_{Game}$ and the $Audio_{Chat}$ in the combined audio output. Thus, the proportions of the components of the combined audio output may be controlled by a setting of the audio mix parameter (which may be stored, for example, in memory element 159 described above with respect to FIG. 1). Such setting of the mix parameter, however, may not always be desirable, as users may not want (or even know how) to properly set the mix parameter. Accordingly, in various implementations in accordance with the present disclosure, control of the combined audio output may be enhanced by simplifying the user interaction/inputs used to control the mixing, particularly by obviating the need for direct user setting of the mix parameter.

For example, rather than requiring the user to expressly select a particular setting for the mix parameter, the user may simply be enabled to separately set a plurality of volume parameters corresponding to the plurality of audio components being mixed. The plurality of audio component volume parameters set by the user may then be processed, and, based on the processing, corresponding settings for the mix parameter may be determined. To ensure compatibility with different sources (e.g., consoles of different makes, models, etc.), translation of the plurality of audio component volume parameters to the mix parameter may be adaptively configured based on a particular source (the device where the combined output is generated) being used. For example, in some example implementations, a console that is being used may be initially characterized. The characterization may then be used during processing of the user selected settings of the plurality of audio component volume parameters.

In some example implementations, separate input elements may be used to allow the separate user volume selections. For example, the user controls 312 of the headset 200 may comprise one or more controls (e.g., two volume setting knobs—"chat volume" and "game volume"; four volume control buttons—"chat up", "chat down", "game up", "game down;" or the like), each of which is configured to set a volume parameter for a respective one of the audio components of the combine audio output. In this manner, the user can use the controls to independently set the game volume and the chat volume.

In some example implementations, a dedicated independent volume control component may be used to support the functions implementing and facilitating independent user volume inputs. Such dedicated independent volume control component may be implemented in or incorporated into one or more of the elements in the audio arrangement. For example, the independent volume control component may be implemented in the headset 400, in the game controller 420 (or the headset connector 422), and/or in the external T/R device 430. This may allow supporting the new independent volume control scheme without requiring change to the game console itself; thus ensuring backward compatibility and/or compatibility with different consoles. Nonetheless, the disclosure is not so limited, and in some embodiments, the independent volume control component may be implemented in the game console itself. The independent volume control component may be implemented as a software module, using existing circuitry of the host device. Alternatively, the independent volume control component may comprise dedicated circuitry for providing the functions and/or operations associated with the component. An example implementation of such component is described in more detail with respect to FIG. 5.

Figure 5:
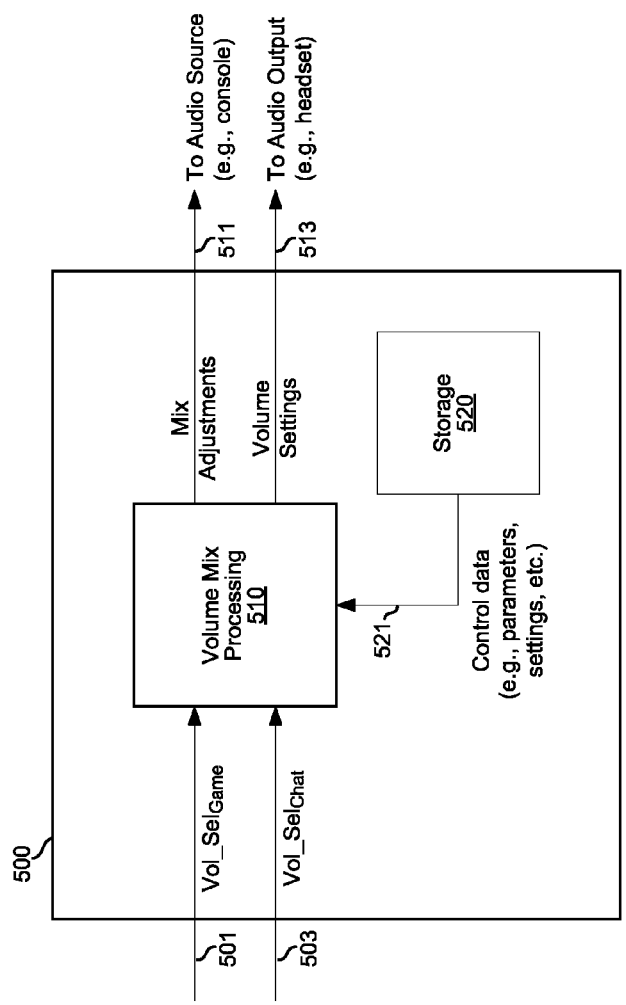
FIG. 5 depicts a block diagram of an example system for independent game and chat volume control.

FIG. 5 depicts a block diagram of an example system for independent game and chat volume control. Shown in FIG. 5 is an example system 500.

The system 500 may comprise suitable circuitry for implementing various aspects of the present disclosure. In particular, the system 500 may be configured to support independent volume control of multiple audio components that are combined into a single audio output from a particular audio source, such as a game console (e.g., game console 410 of FIG. 4). The system 500 may be implemented in, or integrated into, one or more elements in an audio arrangement comprising the source of the combined audio output. For example, as noted with respect to FIG. 4, the system 500 may be implemented in, or integrated into, one or more of the headset 400, the game controller 420, the headset connector 422, and the external T/R device 430 (or, in some instances, even the game console 410 itself). In some implementations, the system 500 may be realized with a micro-processor configured to execute instructions located in a memory.

In the example implementation shown in FIG. 5, the system 500 may comprise a volume mix processing block 510 and a storage element 520. The volume mix processing block 510 may comprise suitable circuitry for processing user input specifying a volume setting for each of a plurality of audio components (e.g., game audio and chat audio) in a combined audio output. Based on such processing, data may be generated, and the data may be used (e.g., communicated as control outputs 511 and/or 513) in controlling or adjusting mixing performed when the combined audio output are generated by mixing the audio components, and/or in controlling or adjusting audio functions or operations performed when outputting the combined audio output comprising the mixed audio components. The storage element 520 may comprise circuitry for storing (and providing when needed) data pertaining to operations or functions of the system 500.

In an example implementation and an example use scenario thereof, once the user enters a new volume setting for one of the audio components of the combined audio output (e.g., a new chat volume setting, shown as $vol\_sel_{Chat}$ 503 in FIG. 5). In this regard, the volume settings may be entered via (or derived from user interactions with) user controls, which may be incorporated into one or more elements in the audio arrangement, such as in one or more of elements 400, 410, 420, 422, and 430 of FIG. 4). For example, the user may specify a new selection for the chat volume setting $vol\_sel_{Chat}$ 503 by turning a chat volume knob. In similar manner, the user may specify instead a new selection for game volume setting, shown as $vol\_sel_{Game}$ 501 in FIG. 5). The following steps may then take place: (1) the difference between the game and chat volumes (e.g., $vol\_diff = vol\_sel_{Chat}$ 503−$vol\_sel_{Game}$ 501) is computed, where the volumes may be represented in decibels (dBs) relative to a determined maximum volume (and thus the difference may also be in decibels); (2) a characterization of the audio source (e.g., the game console 410) is used to determine setting(s) for mix parameter(s) that corresponds to the calculated difference; (3) a command is sent (e.g., as control output 511) to the audio source to set the mix parameter(s) to the determined setting(s); (4) as a result of the command, the mix parameter(s) is/are set by the audio source to the determined setting(s), which results in a change in the respective volumes (and/or other characteristics) of the components of the combined audio output; (5) new setting(s) may be determined (if necessary) for volume parameter(s) of the system 500; (6) the new setting(s) of the volume parameter(s) may be put into effect at a rate that is time synchronized with changes to the combined audio output resulting from the new setting(s) of the mix parameter(s) (which may be known from characterization of the audio source). The setting(s) of the volume parameter(s) may be sent (e.g., as control output 513) to the audio output element(s) (e.g., the headset) that are used in outputting the combined audio.

For example, with respect to the example audio arrangement depicted in FIG. 4, the mix adjustments may be sent (via the control output 511) to the game console 410 (particularly the mix controller 414 thereof), whereas the volume settings may be sent (via the control output 513) to the headset 400 (or to any of the other elements that may affect the volume of the combined audio output, such as the console 410, the game controller 420, the headset connector 422, and/or the T/R device 430).

The volume parameter(s) may control gain (or attenuation) applied in the system 500 to the combined audio output. New setting(s) of the volume parameter(s) may be used to compensate for any change in volume of the combined audio output as a result of the new setting(s) of the mix parameter(s). For example, the volume parameter(s) may be set to or be based on the difference between a target component volume (e.g., $vol\_sel_{Chat}$ 503 or $vol\_sel_{Game}$ 501) and the volume of that component in the combined audio (e.g., the volume parameter may be set to $vol\_sel_{Game}$ 501−$console\_vol_{Game}$, or to $vol\_sel_{Chat}$ 503−$console\_vol_{Chat}$).

The characterization of the audio source (e.g., console) may be implemented as one or more lookup tables. For example, characterization of the audio source may be used to generate two lookup tables: a first lookup table may map various values for the difference between the game and chat volumes (e.g., of vol_diff) to corresponding mix settings (e.g., settings of the mix parameter applied in the audio source); and a second lookup table may map various mix settings (e.g., settings of the mix parameter) to corresponding volume measurements of game component in the combined audio output. In another example implementation source characterization may be used to generate two lookup tables: a first lookup table that contains mappings between different values (settings) of the mix parameter and corresponding game and chat volume combinations; and a second lookup table that contains the volume parameter for each game and chat combination.

The characterization can be pre-programmed, or may be obtained by testing the response of the console to different settings of the mix parameter. The characterization data (e.g., table) may be pre-programmed into the system 500 (e.g., stored in the storage element 520, provided thereby via control signal 521). Alternatively, the characterization data may be obtained dynamically. For example, the characterization data may be obtained using test audio files may be used at the audio source. The test audio files may be used, for example, to generate (or to control or adjust generation of) combined audio output at the audio source. In this regard, the use of such audio test files may allow characterizing the combined audio output—e.g., by allowing monitoring or detecting characteristics of the combined audio output in relation to different ratios of the audio components are mixed into the combined audio output, which (the different ratios) may be predefined in the audio test files. The resultant data is then used to populate the characterization structures (e.g., tables) in the system 500.

In an example use scenario, the characterization table may be generated by: (1) playing test audio for output by the game console as the combined audio output; (2) varying the setting of the mix parameter while playing the test audio; (3) measuring (e.g., RMS voltage) the game component and/or chat component of the combined audio output for various settings of the mix parameter; and (4) normalizing measured values relative to the maximum measured value. The same steps may be performed multiple times for multiple audio components of the combined audio output. The results of the test(s) may then be combined to generate overall characterization table corresponding to different combination of component volume settings.

In an example implementation, outputs of the system 500 may be provided in an adaptive manner (e.g., with some delay and/or with ramping) to enhance and/or optimize user experience. For example, once adjustments or settings (e.g., mixing adjustments for the audio source (e.g., game console), volume adjustments or settings for the audio output (e.g., headset), etc.) are determined based on processing the component volume selections, the adjustments or settings may be output to the console first, and then, after some delay, provided to the audio output (e.g., headset). The delay may be pre-set, or may be determined dynamically. The delay may be determined or set to account for application of the mix adjustments at the game console (e.g., to account for the time it would take the console to apply the adjusted mixing when creating the combined output; the manner by which the mixing adjustment is done, such as single change vs. incremental; etc.). Also, rather than making abrupt changes, adjustments (mixing at the source-side and/or volume at the output-side) may be ramped up (or down) in steps, to avoid sudden and unpleasant changes in audio experienced by the user.

Figure 6:
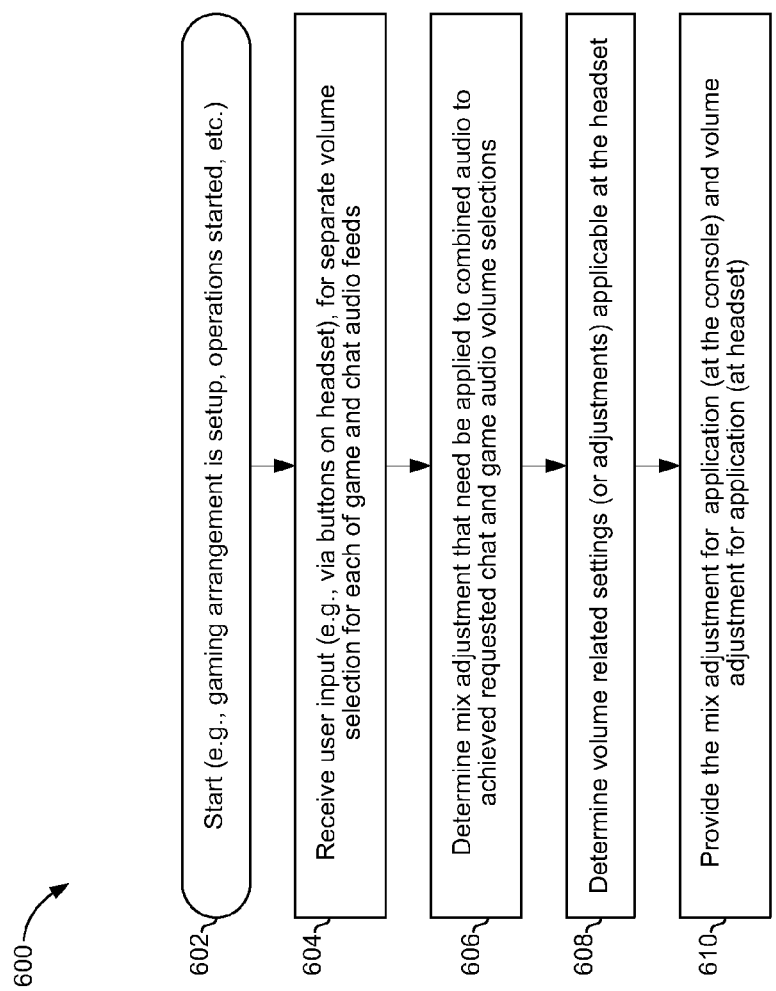
FIG. 6 depicts a flowchart of an example process for independent game and chat volume control.

FIG. 6 depicts a flowchart of an example process for independent game and chat volume control. Shown in FIG. 6 is flow chart 600, which comprises a plurality of example steps (602-610) that may be performed to enable independent game and chat control.

In step 602, at a start state, a gaming arrangement is setup (e.g., connections are setup between various elements of the arrangement, which may comprise a game console, a game controller, and headset), and operations (e.g., gaming, chatting, etc.) are started.

In step 604, user input is received (e.g., via controls on a headset), for separate selections of: (1) desired volume of a game component of a combined-game-and-chat audio signal and (2) desired volume of a chat component of the combined-game-and-chat audio signal.

In step 606, the user input (e.g., volume selections) is processed. Based on the processing, a setting of the mix parameter corresponding to the separately selected chat and game audio volumes is determined.

In step 608, based on processing of the user input and/or on the mix setting determined in block 606, volume settings or adjustments to be applied at the headset are determined. The volume-related settings or adjustments are determined such that, in combination with the mix setting determined in block 606, the desired volume of the game component volume and the desired volume of the chat component are realized at the headset output.

In step 610, the mix setting determined in block 606 may be provided (output) for application at the console, and volume settings or adjustment may be provided (output) for application at the headset.

While the various implementations disclosed herein are described in conjunction with chat-and-game audio, it should be understood that the disclosure is not necessarily so limited, and that similar approach may be used to enhance off-screen sounds in other use scenarios.

The present method and/or system may be realized in hardware, software, or a combination of hardware and software. The present methods and/or systems may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Some implementations may comprise a non-transitory machine-readable (e.g., computer readable) medium (e.g., FLASH drive, optical disk, magnetic storage disk, or the like) having stored thereon one or more lines of code executable by a machine, thereby causing the machine to perform processes as described herein.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. Therefore, it is intended that the present method and/or system not be limited to the particular implementations disclosed, but that the present method and/or system will include all implementations falling within the scope of the appended claims.

What is claimed:

1. A system comprising:
    an input circuit that is operable to receive user input for independently controlling a desired volume setting of an individual component of a combined-game-and-chat audio signal, said individual component comprising one of:
        a chat audio component of said combined-game-and-chat audio signal, and
        a game audio component of said combined-game-and-chat audio signal;
    an audio control circuit that is operable to:
        determine, based on said user input, a corresponding mix setting for mixing together of said chat audio component and said game audio component in an audio source to generate said combined-game-and-chat audio signal;
        determine based on said user input, a corresponding volume setting applicable at an audio output element; and
    an output circuit that is operable to:
        provide said mix setting to said audio source; and
        provide said volume setting to said audio output element.

2. The system of claim 1, wherein said audio control circuit is operable to determine said mix setting based on a data set characterizing said audio source.

3. The system of claim 2, wherein said data set relates to characteristics of said mixing of said chat audio component and said game audio component in said audio source, and/or characteristics of said combined-game-and-chat audio signals in relation to said mixing.

4. The system of claim 2, wherein said data set is pre-programmed or determined based on testing of said audio source.

5. The system of claim 1, wherein said output circuit is operable to adaptively provide one or both of said mix setting and said volume setting.

6. The system of claim 1, wherein said output circuit is operable to adaptively delay providing one or both of said mix setting and said volume setting, based on one or more pre-defined delay time values.

7. The system of claim 5, wherein said output circuit is operable to adaptively provide one or both of said mix setting and said volume setting by using a plurality of ramp up or down steps, to effectuate gradual or stepped changes.

8. The system of claim 1, wherein said output circuit is operable to provide said volume setting such that volume adjustments based on said volume setting are time synchronized to mixing changes based on said mix setting.

9. The system of claim 1, wherein said audio output element is a headset.

10. The system of claim 1, wherein said audio source is a game console, and said audio output element is a game console audio peripheral.

11. A method comprising
in a system comprising an audio source that is operable to a combined-game-and-chat audio signal and at least one audio output element that is operable to output said combined-game-and-chat audio signal:
  receiving user input for independently controlling a desired volume setting of an individual component of said combined-game-and-chat audio signal, said individual component comprising one of:
    a chat audio component of said combined-game-and-chat audio signal, and
    a game audio component of said combined-game-and-chat audio signal;
  determining, based on said user input, a corresponding mix setting for mixing together of said chat audio component and said game audio component in an audio source to generate said combined-game-and-chat audio signal;
  determining based on said user input, a corresponding volume setting applicable at an audio output element;
  providing said mix setting to said audio source; and
  providing said volume setting to said audio output element.

12. The method of claim 11, comprising determining said mix setting based on a data set characterizing said audio source.

13. The method of claim 12, wherein said data set relates to characteristics of mixing of said chat audio component and said game audio component in said audio source, and/or characteristics of said combined-game-and-chat audio signals in relation to said mixing.

14. The method of claim 12, wherein said data set is pre-programmed or determined based on testing of said audio source.

15. The method of claim 11, comprising adaptively providing one or both of said mix setting and said volume setting.

16. The method of claim 11, comprising adaptively delaying a providing of one or both of said mix setting and said volume setting, based on one or more pre-defined delay time values.

17. The method of claim 16, comprising adaptively providing one or both of said mix setting and said volume setting by using a plurality of ramp up or down steps, to effectuate gradual or stepped changes.

18. The method of claim 11, comprising providing said volume setting such that volume adjustments based on said volume setting are time synchronized to mixing changes based on said mix setting.

19. The method of claim 11, wherein said audio output element is a headset.

20. The method of claim 11, wherein said audio source is a game console, and said audio output element is a game console audio peripheral.

21. A system comprising:
  a headset comprising circuitry operable to control mixing together, by an audio source, of a chat audio component and a game audio component to generate a combined-game-and-chat audio signal, wherein the control of the mixing comprises:
    reception of user input for independently controlling a desired volume setting of an individual component of said combined-game-and-chat audio signal, said individual component comprising one of:
      said chat audio component, and
      said game audio component;
    determination, based on said user input, of a corresponding mix setting for said mixing together of said chat audio component and said game audio component; and
    determination, based on said mix setting, of a corresponding gain or attenuation to be applied to said combined-game-and-chat audio signal in said headset.

22. The system of claim 21, wherein said user input is received via one or more user controls of said headset.

* * * * *